United States Patent [19]

Wajima et al.

[11] 4,151,313
[45] Apr. 24, 1979

[54] METHOD FOR PRODUCTION OF PRINTED CIRCUITS BY ELECTROLESS METAL PLATING EMPLOYING A SOLID SOLUTION OF METAL OXIDES OF TITANIUM, NICKEL, AND ANTIMONY AS A MASKING MATERIAL

[75] Inventors: Motoyo Wajima; Mineo Kawamoto; Kanji Murakami; Hirosada Morishita, all of Hitachi; Haruo Suzuki, Katsuta, all of Japan

[73] Assignee: Hitachi, Ltd., Japan

[21] Appl. No.: 884,568

[22] Filed: Mar. 8, 1978

[30] Foreign Application Priority Data

Mar. 11, 1977 [JP] Japan .................................. 52-25975
Jun. 6, 1977 [JP] Japan .................................. 52-65797

[51] Int. Cl.$^2$ .......................... C23C 3/02; H01B 5/14
[52] U.S. Cl. .................................. 427/98; 106/73.3; 156/656; 156/659; 427/97; 427/259; 427/306; 427/307; 427/336
[58] Field of Search .................. 156/659, 656; 427/97, 427/98, 259, 306, 307, 336; 106/73.3

[56] References Cited

U.S. PATENT DOCUMENTS

| 3,443,988 | 5/1969 | McCormack | 427/259 |
|---|---|---|---|
| 3,562,038 | 2/1971 | Shipley | 427/98 |
| 3,672,925 | 6/1972 | Feldstein | 427/305 |
| 3,993,799 | 11/1976 | Feldstein | 427/98 |

FOREIGN PATENT DOCUMENTS 2506150  4/1977  Fed. Rep. of Germany .............. 427/98
2628350 12/1977  Fed. Rep. of Germany .............. 427/96

OTHER PUBLICATIONS

Feldstein, "Selective Electroless Plating Techniques, A Survey," Plating, 8, 1970.
Specification for Electroless Copper Film for Additive Printed Wiring Application (Institute of Printed Circuits, Additive Circuitry Committee, USA, Fall Meeting, 1972).

*Primary Examiner*—John D. Smith
*Attorney, Agent, or Firm*—Craig & Antonelli

[57] ABSTRACT

Printed circuits are produced on an insulating substrate by electroless metal plating according to a method comprising steps of:

(I) forming a plating resist on a negative pattern of circuit with a masking material having an effect upon reducing the deposition of an initiator for electroless metal plating, and depositing the initiator onto the entire surface of the insulating substrate, (II) removing the initiator from the surface of said resist, and (III) dipping the insulating substrate in an electroless metal plating solution, thereby forming an electroless metal plating on a positive pattern of circuit, wherein a thermosetting resin containing a rutile type solid solution of metal oxides of titanium, nickel and antimony is employed as the masking material in said step (I), and the initiator is removed from the surface of the resist through contact with a hydrochloric acid solution of ammonium persulfate in said step (II).

7 Claims, No Drawings

METHOD FOR PRODUCTION OF PRINTED CIRCUITS BY ELECTROLESS METAL PLATING EMPLOYING A SOLID SOLUTION OF METAL OXIDES OF TITANIUM, NICKEL, AND ANTIMONY AS A MASKING MATERIAL

BACKGROUND OF THE INVENTION

This invention relates to a method for producing printed circuits on an insulating substrate by electroless metal plating.

It is well known to apply an electroless metal plating to an insulating substrate, such as plastics, etc. by depositing a noble metal acting as an initiator for electroless metal plating, such as palladium, gold, platinum, etc. onto the surface of the insulating substrate, and then dipping the substrate into an electroless metal plating solution. Two ways are available to form a circuit only on the desired circuit-forming area (which will be hereinafter referred to as "positive pattern") including through-holes on the insulating substrate by the electroless metal plating according to said prior art method.

The one is to selectively deposit the initiator only onto the positive pattern, and the other is to deposit the initiator onto the entire surface of the substrate, and mask other areas than the desired pattern (the other areas will be hereinafter referred to as "negative pattern") by a resist.

Among these two ways, the former ensures a continuous operation from the pretreatment for the electroless metal plating to the electroless metal plating, but is is hard to selectively deposit the initiator onto the positive pattern. In the latter, the resist must be formed on the negative pattern after the deposition of the initiator, and thus the substrate must be dried once on the way as an additional operation. Furthermore, unwanted electroless metal deposition onto the resist on the negative pattern cannot be completely prevented.

U.S. Pat. No. 3,443,988 discloses such an assumption that unwanted electroless metal deposition is caused by surface imperfections such as small dents or scratches which become catalytic by entrapment of electrical charges or activated hydrogen or hydrides during exposure to electroless metal plating solution, and proposes to apply a poison capable of neutralizing catalytic activity in surface imperfections to the resist (column 2, lines 14–26). However, according to tests of the present inventors', it is impossible to deposit the initiator for electroless metal plating only onto the positive pattern.

To selectively deposit the initiator and produce printed circuits by electroless metal plating, for example, the following methods are available:

(1) A method comprising forming a resist film on a negative pattern with a masking material containing an oxidizing agent, and depositing Pd as an initiator on the negative pattern by the oxidation action of the oxidizing agent.

(2) A method comprising forming a resist film on a negative pattern with a hydrophobic masking material containing wax, paraffins, silicone resin or others, and depositing an initiator for electroless metal plating onto a positive pattern.

Some effects can be obtained according to these methods. However, it is generally necessary that the film thickness of conductor circuit for the printed circuits be 30–35 $\mu$m, and furthermore as to the characteristics of the electroless metal film for the conductor circuit, for example, percent elongation of at least 3% and tensile strength of at least 21 kg/mm$^2$ are required, as proposed by Institute of Printed Circuits, USA (Specification for electroless copper film for the additive printed wiring application, proposal, Fall Meeting, 1972). Generally, the electroless metal film that satisfies these characteristics can be obtained only under a severe plating condition, at a higher alkaline such as pH 12-13 (20° C.) and a higher temperature of 60°-80° C. Deposition rate of such electroless metal plating is usually about 0.5 - about 5 $\mu$ m/h, and thus it inevitably takes much time in obtaining the film having a thickness of 30-35 $\mu$m.

In said methods (1) and (2), unwanted metal deposition, though not much, takes place on the resist surface 2 to 3 hours after the start of plating, but such metal deposition is not preferable, because it will be a cause for short circuit in the circuits. This means that the oxidizing agent or the hydrophobic action cannot completely prevent the deposition of the initiator such as Pd, etc onto the resist. To improve these disadvantages, the following methods were proposed, for example:

(3) A method comprising forming a resist on the negative pattern with a masking material containing said oxidizing agent (1), depositing an initiator, removing the initiator only on the resist, and conducting an electroless metal plating only on the positive pattern [German Patent Publication (DAS) No. 2,506,150].

(4) A method comprising forming a resist having the hydrophobic property 2) on the negative pattern, depositing an initiator, and removing Pd deposited on the resist by means of a compound capable of forming a complex compound with Pd, or a method comprising applying a resist having the hydrophobic property (2) on the negative pattern, depositing Sn$^{°+}$, removing Sn$^{++}$ only on the resist by means of an acid, depositing Pd on the positive pattern in an accelerating step, and conducting the electroless metal plating.

In such methods (3) and (4), it is possible to deposit electroless metal only on the positive pattern, but other problems than in said methods (1) and (2) appear. That is, the oxidizing agent in the resist is weak against acid or alkaline solutions, and thus dissolves in the pretreating solution for the electroless metal plating or the electroless metal plating solution itself, thereby promoting deterioration and decomposition of the solution. For example, PbCrO$_4$ or PbO has an effect of oxidizing Sn$^{++}$ to Sn$^{++++}$ and inhibiting deposition of Pd as the initiator. These oxidizing agents dissolve in a highly alkaline metal plating solution, thereby inhibiting the deposition of electroless metal or embrittling the deposited metal films.

On the other hand, the hydrophobic resist containing wax or paraffin cannot withstand the electroless metal plating temperature (60 to 80° C.), and such problems as deformation or melting of the pattern by softening, etc. appear.

U.S. Pat. No. 3,562,038 proposes a method comprising washing merely with an acid without using the resist containing the oxidizing agent or poison. However, when the electroless metal plating is carried out for a long period of time, the electroless metal are deposited even on the resist, and thus it seems that the initiator cannot be completely removed.

STATEMENT OF THE INVENTION

An object of the present invention is to provide an improved method for producing printed circuits by electroless metal plating without any unwanted deposition of electroless metal on a plating resist formed on a negative pattern on an insulating substrate, where an initiator for the electroless metal plating can be completely removed in a simple manner, and a masking material withstanding a strong acid or a strong alkali is employed.

Other objects of the present invention will be apparent from the following description of the invention.

DESCRIPTION OF THE INVENTION

The present invention provides a method for producing printed circuits comprising forming a plating resist on a negative pattern on a surface (one side or both sides) of an insulating substrate including throughholes with a masking material, depositing an initiator for electroless metal plating, removing the initiator on the resist after acceleration, and forming a circuit of electroless metal only on a positive pattern on the surface of the insulating substrate, wherein an improvement comprises (1) the masking material containing a solid solution of oxides of titanium, nickel and antimony, and (2) removing the initiator on the plating resist through contact with a hydrochloric acid solution of ammonium persulfate.

That is, the present invention is based on the finding of such a fact that no metal is deposited on a resist by forming the resist containing a solid solution of oxides of said metals having a resistance to acid and alkali, and contacting the substrate with said hydrochloric acid solution after a series of the pretreatments for the electroless metal plating including the deposition of initiator, acceleration, etc.

It is known that the solid solution of oxides of the metals is stable against the acid and alkali, but the present inventors have found that the solid solution is also stable against a large number of acids including sulfuric acid and hydrochloric acid, pretreating agents for electroless metal plating including metal chelating agents, etc., and alkaline electroless metal plating solutions, and further can weaken a bonding force of initiator to the resist, enabling the initiator on the resist to be readily removed through contact with a hydrochloric acid solution of ammonium persulfate.

The solid solution of oxides of metals, one of the characteristics of the present invention, is a solid solution of oxides of three kinds of metals, that is, titanium, nickel and antimony, and can be obtained by hydrolyzing a sulfuric acid-digested solution of ilmenite (black titanate: $FeTiO_3$), admixing the resulting hydrous oxide of titanium with nickel and antimony, and calcining the mixture, thereby forming a solid solution of the latter metals in rutile type titanium oxide crystals. Specifically, it is represented by $TiO_2$—$NiO$—$Sb_2O_5$, and fine powders of the solid solution can be employed. It is preferable in view of dispersability, printability, etc. that particle sizes of the fine powders should not exceed 10 $\mu m$, preferably should be less than 1.2 $\mu m$.

2 to 40 parts by weight of the solid solution of oxides of metals are added to 100 parts by weight of a resin component constituting the masking material. The solid solution is less effective below 2 parts by weight on one hand, and also is less effective and has a practical trouble in settling or printability above 40 parts by weight on the other hand.

The resin component is desirably thermosetting resins, for example, epoxy resin, silicone, phenol resin, urea resin, melamine resin, acryl resin, unsaturated polyester resin, etc. In order to improve the luster of the resist film, a thermoplastic resin can be added to the thermosetting resin.

A resist is formed on a negative pattern by means of said masking material usually according to screen printing (a printing method using a silk screen or stainless steel screen). Thus, the masking material is dissolved in an organic solvent, and used as a resist ink by adjusting a viscosity of the resulting solution. The organic solvent includes, for example, ketones, alcohols, etherified or esterified alcohols, polyhydric alcohols, dimethylformamides, etc. Before adjusting the viscosity of the solution, pigments and fillers can be added to the solution, if necessary. The pigments include, for example, Guignet's green, cobalt blue, phthalocyanine blue, phthalocyanine green, naphthol green, etc. The fillers include, for example, silicon oxide, aluminum oxide, zirconium silicate, aluminum silicate, calcium carbonate, barium sulfate, clay, ceramic fine powders, etc. The amount of the pigments and the fillers entirely depends upon the kind of resin, desired printing characteristics, color of printed film, etc. and cannot be specified, but generally 1 to 20 parts by weight of the pigments and the fillers can be added to 100 parts by weight of the resin component.

The most preferable masking material of the present invention has the following composition:

(a) 100 parts by weight of epoxy resin, (b) an effective amount of a curing agent and/or curing catalyst for the epoxy resin, (c) 0.5 to 3 parts by weight of copolymers of acrylic acid esters comprising at least two kinds of acrylic acid monomers, having a molecular weight of 10,000 to 50,000.

(d) 2 to 40 parts by weight of solid solution of oxides of titanium, nickel and antimony, and (e) a necessary amount of an organic solvent for mixing, dissolving and dispersing said components (a) to (d) to make a viscosity of the resulting solution 150 to 450 poises (20° C., B-type rotary viscometer, SC4-14 rotor, 100 rpm)

As the epoxy resin (a), bisphenol A type epoxy resin is preferable. Especially, when a nitrile rubber-based adhesive is used to bond a plated film to a substrate, sometimes its bonding force is lowered or a flat, lustrous resist film is not obtained, depending upon the kind of the epoxy resin. Thus, it is preferable in view of said fact to use bisphenol A type epoxy resin having an epoxy equivalent amount of 900 or higher as the epoxy resin. In that case, the flowability is lowered, and thus it is preferable to use bisphenol A type or Novolak type epoxy resin having an epoxy equivalent amount of less than 500 at the same time to improve the flowability. The amount of said epoxy resin having the epoxy equivalent amount of less than 500 is less than 40% by weight on basis of the entire epoxy resin.

(b) The usually employed curing agent or curing catalyst for the epoxy resin can be used; for example, ethylenediamine, diethylenetriamine, triethylenetetramine, tetraethylenepentamine, dicyandiamide, cyclohexylamine, benzylamine, triethanolamine, piperidine, N-(aminoethyl)piperazine, diaminobenzoic acid, etc. can be used. Furthermore, aromatic amines such as diamino-diphenylmethane, metaphenylenediamine, etc. can be also used. As the catalyst, $BF_3$-amine complex compound, benzyldimethylamine, N,N,N',N'-tetramethyl-1,3-butanediamine, imidazols, quaternary ammonium salts, stannous octoate, 2,4,6-tris(dimethylaminophenol), tetramethylguanidine, 1,8-diazabicyclo(5,4,0)-7-undecene, tetraphenylphosphonium borate, tetraethylammonium borate, tetramethylammonium fluoride, mercaptobenzothiazole salts, etc. can be used.

The curing agent or catalyst can be appropriately selected according to the epoxy resin used or conditions employed, and also can be added in an appropriate manner, depending upon the kind of the curing agent or catalyst, for exampe, by directly adding it to the epoxy resin, or by two-pack type usually employed, where two solutions are mixed together just before employed.

(c) The copolymers of acrylic acid esters can be synthesized according to a process disclosed in Japanese Kokai (Laid-Open) Patent Application Specification No. 125,744/75, and 0.5 to 3 parts by weight of the copolymers having a molecular weight of preferably 10,000 to 50,000 is added to 100 parts by weight of the epoxy resin, whereby a development of orange peel, a phenomenon of a resist film surface being turned to a orange-like surface, can be prevented when the resist film is formed.

(d) The solid solution of oxides of titanium, nickel and antimony is a solid solution of $TiO_2$—$NiO$-$Sb_2O_5$, and preferably 2 to 40 parts by weight of the solid solution is added to 100 parts by weight of the resin component, as described in the foregoing.

(e) The solvent is added thereto in an amount necessary for mixing, dissolving and dispersing said components (a) to (d) to make a viscosity of the resulting solution 150 to 450 poises (B type rotary viscometer SC4-14 rotor, 100 rpm, 20° C.).

The masking material having the foregoing composition is coated on a negative pattern of an insulating substrate according to a screen printing method or others, and cured at 100° to 160° C. for 10 to 60 minutes, whereby a resist film is formed.

An initiator of known material is deposited on the insulating substrate having the resist thus formed according to the known procedure, and accelerated. One example of the initiator solution used in said pretreating step is a hydrochloric acid solution of stannous chloride ($SnCl_2.2H_2O$) and palladium chloride ($PdCl_2$). The acceleration is carried out by an acid or alkaline solution. The acid solution includes, for example, hydrogen fluoride or oxalic acid, or other dissolved in a hydrochloric acid solution and diluted in water, and the alkaline solution includes, for example, an aqueous sodium hydroxide solution containing a metal chelating agent such as triethanolamine, ethylenediamine tetraacetate salt, etc. in a solution state.

The initiator deposited on the resist must be removed from the insulating substrate treated with said accelerating solution to prevent unwanted deposition of electroless metal on the resist. As the initiator-removing solution, ammonium persulfate dissolved in dilute hydrochloric acid is used. The initiator deposited on the resist can be readily removed by contacting the substrate with the solution and then washing the substrate with water. Hydrochloric acid, sulfuric acid, nitric acid, etc. are considered to be applicable as the initiator-removing solution, but will attack the substrate, and remove even the initiator deposited on the positive pattern itself. The dilute hydrochloric acid solution of ammonium persulfate is most effective for removing the initiator on the resist by the synergistic effect with the solid solution of oxides of metals. The preferable composition can be obtained by dissolving 0.5 to 20 g of ammonium persulfate in 50 to 200 ml of 35% hydrochloric acid, and diluting the resulting solution to 1 l with water. When the insulating substrate is made to contact such inorganic acid solution, for example, by dipping, it is sufficient to dip it at a liquid temperature of 15° to 25° C. (room temperature) for 3 to 15 minutes.

It is not clear why the initiator on the resist containing the solid solution of oxides of metals is so releasable when brought in contact with said inorganic acid solution. It seems that the initiator, for example, Pd, on the resist is probably converted to such a compound as Pd(Ti—Ni—Sb) by said $TiO_3$—$NiO$—$Sb_2O_5$, and the resulting compound is readily dissolvable in said inorganic acid solution. The solid solution of oxides of metals is never a "poison", as mentioned in U.S. Pat. No. 3,443,988, as is obvious from the fact that the electroless metal are liable to be deposited on the resist if no treatment is made with said inorganic acid solution.

The insulating substrate used in the present invention includes, for example, a paper-based phenolic resin laminate, paper-based epoxy resin laminate, glass cloth-based epoxy resin laminate, glass cloth-based polyimide laminate, etc. The laminate is provided with holes according to the desired circuit. The effect of the present invention can be more improved by increasing a wettability of the substrate, for example, by grinding, chemical roughening, etc. of the substrate to provide for the electroless metal plating.

As the electroless metal plating solution, for example, an electroless copper plating solution contains the following components: copper sulfate, copper acetate, copper carbonate, copper formate, etc. as a metal salt; Rochelle salt, ethylenediaminetetraacetic acid, etc. as a complexing agent; formalin, paraformaldehyde, etc., as a reducing agent; and sodium or potassium hydroxide as a pH controller. In addition to these basic components, for example, sulfur compounds, cyanide compounds, pyridines, alcohols or glycols can be added thereto to improve the stability of the plating solution or physical properties of the resulting plated film. The desired plated film can be obtained by subjecting such electroless copper plating solution to plating operation at pH 12–13 (20° C.) and a plating temperature of 60° to 80° C. for about 5 to 36 hours.

Now, the present invention will be described in detail below, referring to Examples, where "part" is by weight.

EXAMPLE 1

Phenolic resin-modified nitrile rubber-based, thermosetting adhesive (NB-3033 produced by Sale Tilney, Ltd., Japan) was applied to a paper-based phenolic resin laminate (LP-43N produced by Hitachi Kasei Kogyo K.K., Japan) according to a curtain coat method, and cured by heating at 165° C. for 80 minutes. Then, the laminate was provided with holes at necessary locations, and a masking material containing solid solution of oxides and having the following composition (viscosity at 20° C.: 200 poises) was formed on a negative pattern thereof according to a stainless steel printing method:

| Masking material composition: | | |
|---|---|---|
| Epoxy resin: | Epikote 1007 (produced by Shell Chemical Company, USA; epoxy equivalent amount: 2200) | 65 parts |
| | Epikote 828 (produced by Shell Chemical Com- | |

-continued

Masking material composition:

| | | |
|---|---|---|
| | pany, USA; epoxy equivalent amount: 188) | 35 parts |
| Filler: | Silicon oxide | 2 parts |
| | Calcium carbonate | 4 parts |
| | Zirconium silicate | 2 parts |
| Pigment: | Phthalocyanine blue | 2 parts |
| Solid solution of oxides: | | |
| | $TiO_2$—$NiO$—$Sb_2O_5$ (produced by Ishihara Sangyo K.K., Japan; particle sizes: 0.8 - 1.2 μm) | 20 parts |
| Solvent: | Butyl carbitol | 40 parts |
| | Methyl cellosolve | 10 parts |
| Curing agent: | Dicyandiamide | 5 parts |
| | N,N,N',N'-tetramethyl-butanediamine | 1.1 part |

Then, the masking material was cured at 145° C. for 40 minutes to form a resist film on the laminate. Then, the laminate was dipped in a chromium-sulfuric acid mixed solution (prepared by dissolving 50 g of $CrO_3$ in 200 ml of concentrated sulfuric acid and making the resulting solution 1 l with water) at 40° C. for 7 minutes to roughen the positive pattern, and washed with water and neutralized. Then, the laminate was dipped in a solution consisting of 400 ml of 35% HCl and 600 ml of water for one minute, then dipped in aqueous hydrochloric acid solution containing stannous chloride and palladium chloride in a solution state as an initiator solution (sensitizer HS101B produced by Hitachi Kasei Kogyo K.K. Japan) for 5 minutes, and then washed with water for one minute. Then, the laminate was dipped in an aqueous alkaline solution containing a metal chelating agent as an accelerating solution (adhesion promoter ADP101 produced by Hitachi Kasei Kogyo K.K., Japan) for 5 minutes, and washed with water for one minute. Then, the laminate was dipped in an inorganic acid solution having the following composition for 4 minutes, and washed with water for one minute.

| Inorganic acid solution composition: | |
|---|---|
| Ammonium persulfate | 3.0 g |
| 35% hydrochloric acid | 80 ml |
| Water to make the entire solution 1 l | |

A plated film having a thickness of about 35 μm was deposited onto the positive pattern of the substrate with an electroless copper plating solution having the following composition at 70° C. over a period of 11 hours, and no deposition of electroless metal was found on the resist containing the solid solution of oxides of metals printed on the negative pattern on the surface of the substrate.

| Electroless copper plating solution composition: | | |
|---|---|---|
| Metal salt: | copper sulfate | 10 g |
| Complexing agent: | ethylenediamine tetraacetic acid | 30 g |
| Reducing agent: | 37% formalin | 4 ml |
| pH controller: | sodium hydroxide in an amount to make pH 12.9 (20° C.) | |
| Additive: | polyethylene glycol (molecular weight: 400) | 30 ml |
| Water to make the entire solution 1 l | | |

EXAMPLE 2

The masking material of Example 1 was replaced with the one having the following composition:

| | | |
|---|---|---|
| Epoxy resin: | Epikote 1004 (produced by Shell Chemical Co., USA, epoxy equivalent amount: 950) | 70 parts |
| | DEN438 (produced by Dow Chemical Company, USA, Novolak-type epoxy resin, epoxy equivalent amount: 178) | 30 parts |
| Filler: | Aluminum oxide | 4.5 parts |
| | Zirconium silicate | 4 parts |
| Pigment: | Guignet's green | 3 parts |
| Solid solution of oxides: | $TiO_2$—$NiO$—$Sb_2O_5$ | 10 parts |
| Curing agent: | Dicyandiamide | 5 parts |
| | 2-Ethyl-4-methylimidazol | 0.7 part |
| Organic solvent: | Butyl carbitol | 25 parts |
| | Dimethyl formamide | 10 parts |

Said masking material was printed on a negative pattern on a laminate according to a screen printing method as in Example 1, and cured at 140° C. for 45 minutes. The successive operations were conducted in the same manner as in Example 1, except that catalyst 6F produced by Shipley, Japan was used in the initiator solution and Accelator 19 produced by Shipley, Japan was used as an acidic type in the accelerating solution in the pretreating steps for the electroless copper plating.

An inorganic acid solution having the following composition was used in the successive step, and the laminate was dipped therein for 10 minutes:

| Inorganic acid solution composition: | |
|---|---|
| Ammonium persulfate | 10 g |
| 35% hydrochloric acid | 100 ml |
| Water to make the entire solution 1 l | |

In the successive step, a plated film was deposited only on the positive pattern with the same electroless copper plating solution as in Example 1 under the same conditions as in Example 1, and no deposition of electroless copper was found on the resist.

EXAMPLE 3

Operations were carried out in the same manner as in Example 2 to produce a printed circuit except that 40 parts of the solid solution of oxides ($TiO_2$—$NiO$—$Sb_2O_5$) was used in the masking material of Example 1, and the laminate was dipped in the inorganic acid solution having the following composition for 15 minutes.

| Inorganic acid solution composition: | |
|---|---|
| Ammonium persulfate | 0.7 g |
| 35% hydrochloric acid | 180 ml |
| Water to make the entire solution 1 l | |

No deposition of electroless copper was found on the resist containing the solid solution of oxides.

EXAMPLE 4

Operations were carried out in the same manner as in Example 1 to produce a printed circuit, except that 2 parts of the solid solution of oxides ($TiO_2$—$NiO$—$Sb_2O_5$) was used in the masking material of Example 1 and the laminate was dipped in an inorganic acid solution having the following composition for 5 minutes.

| Inorganic acid solution composition: | |
|---|---|
| Ammonium persulfate | 18 g |
| 35% hydrochloric acid | 55 ml |
| Water to make the entire solution 1 l | |

No deposition of electroless copper was found on the resist containing the solid solution of oxides.

EXAMPLE 5

A paper-based phenolic resin laminate, whose entire surfaces were coated with a masking material containing 10 parts of the solid solution of oxides of metals as used in Example 2, and a paper-based phenolic resin laminate, whose entire surfaces were coated with a masking material containing the same 10 parts of an oxidizing agent $PbCrO_4$ in place of said solid solution of oxides of metals, were dipped individually in an electroless copper plating solution as given in Example 1. As a result, $PbCrO_4$ was dissolved into the plating solution from the laminate coated with the masking material containing $PbCrO_4$, and color of the resist film was faded away 2-3 hours thereafter. On the other hand, no change was found on the resist film of the laminate coated with the present masking material containing the solid solution of oxides of metals even after dipping for 60 hours.

Stainless steel plates were subjected to plating, using said two plating solutions after said test individually. No plating reaction took place in the plating solution containing dissolved $PbCrO_4$, whereas a plated film having a percent elongation of 3.3% and a tensile strength of 32.8 kg/mm$^2$ was obtained from the plating solution which the present resist containing the solid solution of oxides of metals was dipped in, and its plated film characteristics were not different at all from the characteristics obtained from the normal plating solution.

EXAMPLE 6

1.5 Parts of copolymers of acrylic acid esters (copolymers of 93% by mole of isobutyl methacrylate and 15% by mole of glycidyl methacrylate; molecular weight: 30,000) was added to the masking material having the same composition as in Example 2. A printability was improved thereby and a resist film having a good film luster was obtained after curing. When 30 parts of epoxy resin having an epoxy equivalent amount of 188 was added to 70 parts of epoxy resin having an epoxy equivalent amount of 900 or higher, a releasability between screen and laminate was improved. When the resulting laminate was subjected to the electroless plating, no deposition of the electroless metal was found on the resist.

EXAMPLE 7

When 0.5 parts of polyvinyl butyral (molecular weight: about 13,000) was added to the masking material as used in Example 6, a bonding strength of the resist film to the laminate was increased to about two times (600 kg/cm$^2$) when not added. No deposition of electroless metal was found on the resist when electroless plating was conducted in the same manner as in Example 1.

As described in detail above, the initiator for the plating reaction can be simply removed from the surface of the resist, and thus no unwanted deposition of electroless metal is made on the resist. No adverse effect is given upon the electroless plating solution or the pretreating solution for the electroless plating.

What is claimed is:

1. A method for producing a printed circuit comprising the following steps:
    (I) forming a plating resist on a negative pattern on circuit on a substrate with a masking material having an effect of reducing deposition and adhesion of a palladium initiator for electroless metal plating, and depositing a palladium initiator on an entire surface of substrate,
    (II) removing the initiator on the resist, and
    (III) dipping the substrate in an electroless metal plating solution, thereby forming electroless metal films on a positive pattern of the circuit, wherein an improvement comprises using a thermosetting resin containing a solid solution of oxides of titanium, nickel and antimony as the masking material in said step (I) and contacting the substrate with a hydrochloric acid solution of ammonium persulfate in said step (II) as a means for removing the initiator on the resist.

2. A method according to claim 1, wherein a masking material containing 2 to 40 parts by weight of rutile type solid solution of $TiO_2$—$NiO$—$Sb_2O_5$ as the solid solution of oxides per 100 parts by weight of the thermo-setting resin was used in said step (I), and a solution containing 0.5 to 20 g of ammonium persulfate, 50 to 200 ml of 35% hydrochloric acid, and water to make the entire solution 1 l is used as the hydrochloric acid solution of ammonium persulfate in said step (II).

3. A method according to claim 2, wherein bisphenol A type epoxy resin having an epoxy equivalent amount of 900 or higher is used as the thermo-setting resin for the masking material in said step (I).

4. A method according to claim 2, wherein a mixture of bisphenol A type epoxy resin having an epoxy equivalent amount of 900 or higher with less than 40% by weight of bisphenol A type or novolak type epoxy resin having an epoxy equivalent amount of less than 500 on the basis of entire epoxy resins is used as the thermo-setting resin for the masking material in said step (I).

5. A method according to claim 2, wherein said solid solution is in the form of fine powders having a particle size not exceeding 10μm.

6. A method according to claim 5, wherein the particle size is less than 1.2μm.

7. A method according to claim 2, wherein said substrate is contacted with said hydrochloric acid solution in said step (II) at a solution temperature of 15° to 25° C. for 3-15 minutes.

* * * * *